(12) United States Patent
Shieh

(10) Patent No.: US 11,686,784 B1
(45) Date of Patent: Jun. 27, 2023

(54) MOVEMENT SENSING DEVICE

(71) Applicant: Chia-Chih Shieh, New Taipei (TW)

(72) Inventor: Chia-Chih Shieh, New Taipei (TW)

(73) Assignee: iSentek Inc., New Taipei (TW)

( * ) Notice: Subject to any disclaimer, the term of this patent is extended or adjusted under 35 U.S.C. 154(b) by 0 days.

(21) Appl. No.: 17/834,937

(22) Filed: Jun. 8, 2022

(30) Foreign Application Priority Data

May 20, 2022 (TW) .................................. 111118877

(51) Int. Cl.
*G01B 7/00* (2006.01)
*G01R 33/022* (2006.01)
*G01R 33/00* (2006.01)

(52) U.S. Cl.
CPC ....... *G01R 33/022* (2013.01); *G01R 33/0005* (2013.01)

(58) Field of Classification Search
CPC .......................... G01R 33/022; G01R 33/0005
See application file for complete search history.

(56) References Cited

U.S. PATENT DOCUMENTS 9,359,884 B2 * 6/2016 Hallundbk ............. G01N 27/72

FOREIGN PATENT DOCUMENTS

CN 114593728 6/2022
TW 202120022 6/2021

OTHER PUBLICATIONS

"Office Action of Taiwan Counterpart Application", dated Jul. 29, 2022, p. 1-p. 3.

* cited by examiner

*Primary Examiner* — Alesa Allgood
(74) *Attorney, Agent, or Firm* — JCIPRNET

(57) ABSTRACT

Disclosed is a movement sensing device adapted to sense an amount of movement of an object. The movement sensing device includes a first magnetic sensor, a second magnetic sensor, a special-shaped magnetic element, and a controller. The special-shaped magnetic element has a magnetization direction, is connected with the object, and is adapted to be moved along a direction parallel to a connection line between the first magnetic sensor and the second magnetic sensor. The special-shaped magnetic element, the first magnetic sensor, and the second magnetic sensor are disposed on a plane. The magnetization direction is perpendicular to the plane. The controller is electrically connected to the first magnetic sensor and the second magnetic sensor. The controller calculates the amount of movement according to a difference between magnetic forces sensed by the first magnetic sensor and the second magnetic sensor from the special-shaped magnetic element.

12 Claims, 4 Drawing Sheets

MOVEMENT SENSING DEVICE

CROSS-REFERENCE TO RELATED APPLICATION

This application claims the priority benefit of Taiwanese application no. 111118877, filed on May 20, 2022. The entirety of the above-mentioned patent application is hereby incorporated by reference herein and made a part of this specification.

BACKGROUND

Technical Field

The disclosure relates to a movement sensing device.

Description of Related Art

The principle of sensing by a conventional movement sensing device is to calculate a change in movement of a magnetic element (a magnet, for example) by utilizing a change in a magnetic field of the magnetic element in a space. Since the magnetic element forms a magnetic field with a direction and a magnitude in a space, the change in movement of the magnetic element can be calculated by obtaining the change in the magnetic field in a space.

In terms of design, the conventional movement sensing device estimates the change in movement of the magnetic element by utilizing a curve chart of a difference between magnetic forces sensed by two sensors at two different positions relative to a position of the magnetic element. However, for the conventional movement sensing device, the application cost may be increased if the curve chart presents a nonlinear relationship. Comparatively, to present a linear relationship in the curve chart requires a sufficient distance between the magnetic element and the sensors, which limits the range of applications.

SUMMARY

The disclosure provides a movement sensing device, in which linearity is presented in a difference between magnetic forces relative to an amount of movement.

An embodiment of the disclosure provides a movement sensing device adapted to sense an amount of movement of an object. The movement sensing device includes a first magnetic sensor, a second magnetic sensor, a special-shaped magnetic element, and a controller. The special-shaped magnetic element has a magnetization direction, is connected to the object, and is adapted to be moved along a direction parallel to a connection line between the first magnetic sensor and the second magnetic sensor. The special-shaped magnetic element, the first magnetic sensor, and the second magnetic sensor are disposed on a plane. The magnetization direction is perpendicular to the plane. The controller is electrically connected to the first magnetic sensor and the second magnetic sensor. The controller calculates the amount of movement according to a difference between magnetic forces sensed by the first magnetic sensor and the second magnetic sensor from the special-shaped magnetic element. The amount of movement is a distance between a reference point on the special-shaped magnetic element and a center point in the direction parallel to the connection line. The center point is a center between a position of the first magnetic sensor and a position of the second magnetic sensor.

Based on the foregoing, in the movement sensing device in an embodiment of the disclosure, since the magnetic element is designed as a special-shaped magnetic element, linearity is presented in the difference between magnetic forces sensed by the first magnetic sensor and the second magnetic sensor relative to the amount of movement of the special-shaped magnetic element.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
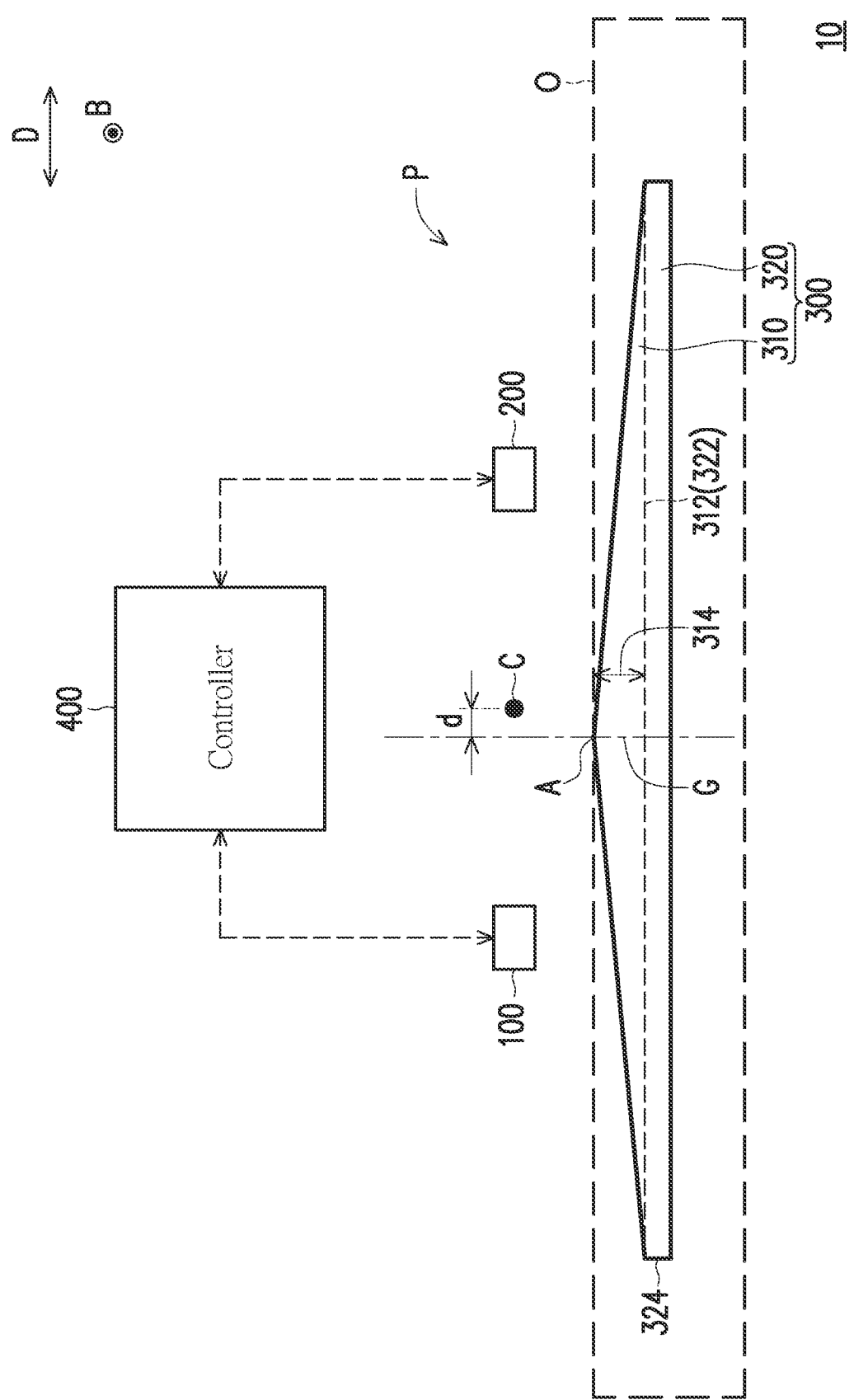
FIG. 1 is a schematic view of a movement sensing device according to an embodiment of the disclosure.

FIG. 1 is a schematic view of a movement sensing device according to an embodiment of the disclosure. With reference to FIG. 1, an embodiment of the disclosure provides a movement sensing device 10 adapted to sense an amount of movement d of an object O. The movement sensing device 10 includes a first magnetic sensor 100, a second magnetic sensor 200, a special-shaped magnetic element 300, and a controller 400. The special-shaped magnetic element 300 is adapted to be connected with the object O. During movement of the special-shaped magnetic element 300, a change in a magnetic field of the special-shaped magnetic element 300 in a space is sensed by utilizing the first magnetic sensor 100 and the second magnetic sensor 200. Then, an amount of movement d of the special-shaped magnetic element 300 is calculated by utilizing the controller 400 to thus obtain the amount of movement d of the object O. For example, the object O is an interpupillary distance adjustment mechanism of a lens group in a head-mounted display. When a user adjusts an interpupillary distance of the lens group through the interpupillary distance adjustment mechanism, the controller 400 may obtain the amount of movement d of the object O. Then, the controller 400 transmits the amount of movement d to a control module in the head-mounted display for the control module to obtain the interpupillary distance of the lens group.

To be specific, the first magnetic sensor 100 or the second magnetic sensor 200 of this embodiment may be a Hall sensor or a magnetic sensor in any other form. The special-shaped magnetic element 300 may be a magnet, an electromagnet, or a magnetic element in any other form. The special-shaped magnetic element 300 has a magnetization direction B, and is adapted to be moved along a direction D parallel to a connection line between the first magnetic sensor 100 and the second magnetic sensor 200. The special-shaped magnetic element 300, the first magnetic sensor 100, and the second magnetic sensor 200 are disposed on a plane P. The magnetization direction B is perpendicular to the plane P.

In this embodiment, the controller 400 includes, for example, a microcontroller unit (MCU), a central processing unit (CPU), a microprocessor, a digital signal processor (DSP), a programmable controller, a programmable logic device (PLD), or other similar devices or a combination of these devices, which is not limited by the disclosure. In addition, in an embodiment, the functions of the controller 400 may be implemented as a plurality of codes. These codes are stored in memory and are executed by the controller 400. Alternatively, in an embodiment, the functions of the controller 400 may be implemented as one or more circuits. The functions of the controller 400 may be implemented in the form of software or hardware, which is not limited by the disclosure.

In this embodiment, the controller 400 is electrically connected to the first magnetic sensor 100 and the second magnetic sensor 200. The controller 400 calculates the amount of movement d according to a difference between magnetic forces sensed by the first magnetic sensor 100 and the second magnetic sensor 200 from the special-shaped magnetic element 300 (in a direction perpendicular to the plane P or parallel to the magnetization direction B). The amount of movement d is a distance between a reference point G on the special-shaped magnetic element 300 and a center point C in the direction D parallel to the connection line, and the center point C is a center between a position of the first magnetic sensor 100 and a position of the second magnetic sensor 200. The reference point G may be defined as a geometric center or a vertex A of the special-shaped magnetic element 300, and the disclosure is not limited thereto.

Figure 2:
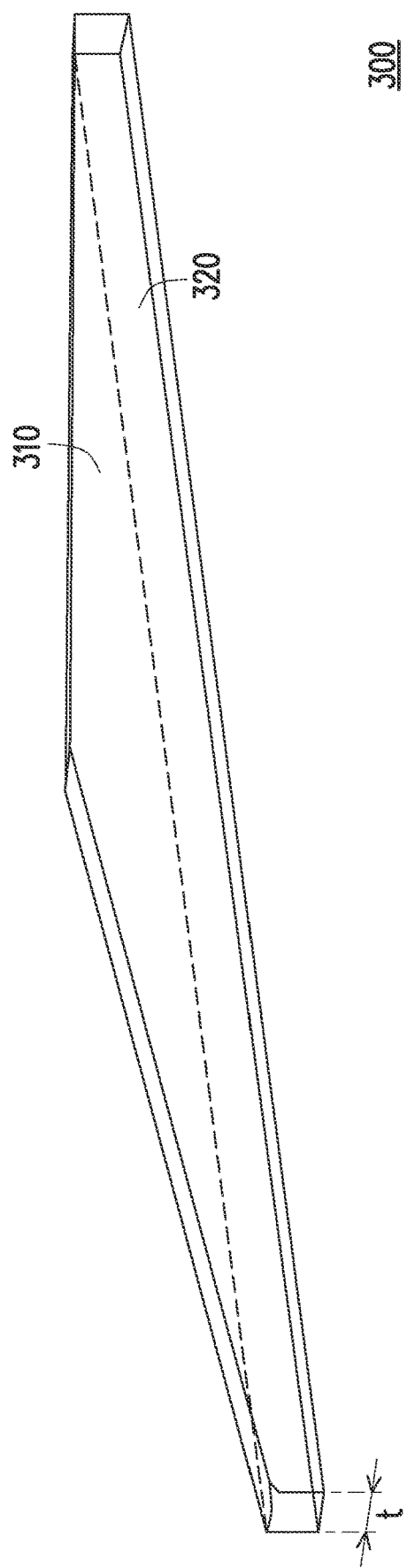
FIG. 2 is a schematic view of the special-shaped magnetic element in FIG. 1 from another perspective.

FIG. 2 is a schematic view of the special-shaped magnetic element in FIG. 1 from another perspective. With reference to FIG. 1 and FIG. 2 together, in this embodiment, the special-shaped magnetic element 300 includes a first part 310 (with a section along a direction parallel to the plane P) in a shape of an isosceles triangle. In another embodiment, the special-shaped magnetic element 300 further includes a second part 320 (with a section along the direction parallel to the plane P) in a shape of a rectangular. A long side 322 of the second part 320 is connected with a bottom side 312 of the first part 310, and the length of the long side 322 is substantially the same as the length of the bottom side 312. In other words, the special-shaped magnetic element 300 may includes the first part 310 alone. However, considering the limit of the manufacturing process, the special-shaped magnetic element 300 may include the second part 320. A short side 324 of the second part 320 is less than or equal to a height 314 of the first part 310. For example, a ratio of the short side 324 to the height 314 falls within a range from 0 to 1.

In addition, in this embodiment, a ratio of a thickness t of the special-shaped magnetic element 300 (in the direction perpendicular to the plane P) to the height 314 of the first part 310 falls within a range from 0.1 to 1, and a ratio of the thickness t to the bottom side 312 of the first part 310 falls within a range from 0.01 to 0.1. A ratio of the height 314 to the bottom side 312 of the first part 310 of the special-shaped magnetic element 300 falls within a range from 0.02 to 0.2, and a ratio of the short side 324 to the long side 322 of the second part 320 falls within a range from 0.01 to 0.1. The thickness t of the special-shaped magnetic element 300 and the short side 324 of the second part 320 may be designed as thin and light as possible, for example, to the limit of the manufacturing process. However, considering the structural robustness of the special-shaped magnetic element 300 and prevention of excessive fragility of the special-shaped magnetic element 300, the thickness t of the special-shaped magnetic element 300 and the length of the short side 324 of the second part 320 fall within a range from 0.3 millimeter (mm) to 1 mm, for example. In addition, the size of the thickness t has relatively small influences on linearity of the movement sensing device 10, while having a proportional influence on the overall strength of the special-shaped magnetic element 300. Accordingly, it is required to consider not only lightweighting but also the structural robustness of the device.

In this embodiment, a distance between any two of the vertex A of the first part 310 of the special-shaped magnetic element 300, the first magnetic sensor 100, and the second magnetic sensor 200 is greater than 0. Moreover, the amount of movement d of the special-shaped magnetic element 300 may be less than or equal to a distance between the position of the first magnetic sensor 100 and the center point C. In other words, the movement range of the special-shaped magnetic element 300 may fall between the first magnetic sensor 100 and the second magnetic sensor 200 to maintain a linear relationship in the amount of movement d measured by the movement sensing device 10.

Figure 3:
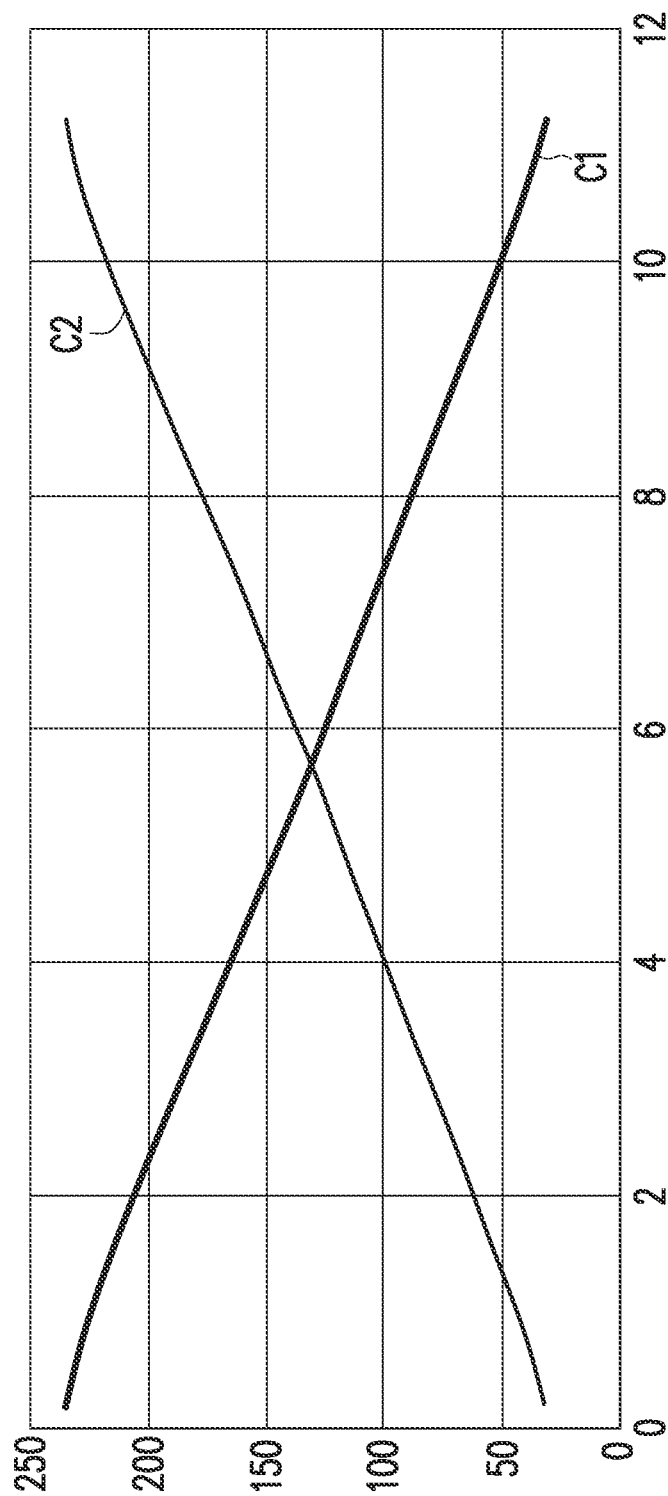
FIG. 3 is a curve chart of magnetic forces sensed by a first magnetic sensor and a second magnetic sensor of a movement sensing device according to an embodiment of the disclosure.
Figure 4:
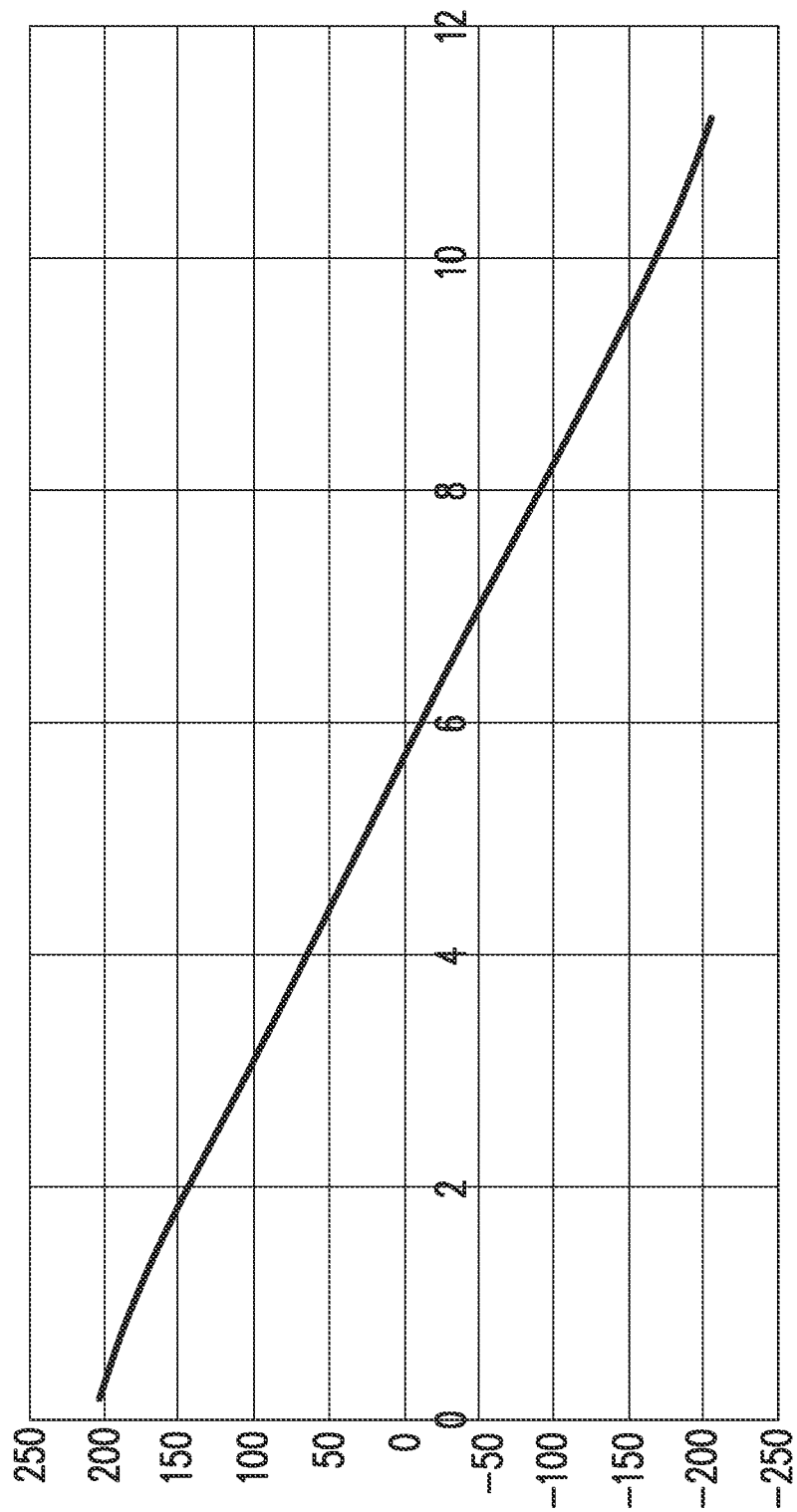
FIG. 4 is a curve chart of subtracting a curve C2 from a curve C1 in FIG. 3.

FIG. 3 is a curve chart of magnetic forces sensed by a first magnetic sensor and a second magnetic sensor of a movement sensing device according to an embodiment of the disclosure. FIG. 4 is a curve chart of subtracting a curve C2 from a curve C1 in FIG. 3. With reference to FIG. 1 to FIG. 4, for example, the first magnetic sensor 100 and the second magnetic sensor 200 are each disposed at a distance of 6.5 mm from the center point C, and a distance between the vertex A of the first part 310 of the special-shaped magnetic element 300 and the center point C in a direction perpendicular to the direction D parallel to the connection line is 1.5 mm. Moreover, the special-shaped magnetic element 300 is designed as follows: the height 314 of the first part 310 is 2 mm, the bottom side 312 of the first part 310 is 22 mm, the short side 324 of the second part 320 is 0.3 mm, and the thickness t of the special-shaped magnetic element 300 is 0.5 mm.

In FIG. 3, the curve C1 and the curve C2 are curves of the magnetic field strengths respectively sensed by the first magnetic sensor 100 and the second magnetic sensor 200 relative to the amount of movement d of the special-shaped magnetic element 300 when the special-shaped magnetic element 300 moves from proximity to the first magnetic sensor 100 to proximity to the second magnetic sensor 200. In FIG. 3 and FIG. 4, the unit of the horizontal axis is mm, and the unit of the vertical axis is Gauss. According to FIG. 4, linearity is presented in the curve of the difference between magnetic forces relative to the amount of movement d.

In summary of the foregoing, in the movement sensing device in an embodiment of the disclosure, since the magnetic element is designed as a special-shaped magnetic element, linearity is presented in the difference between magnetic forces sensed by the first magnetic sensor and the second magnetic sensor relative to the amount of movement of the special-shaped magnetic element. Since linearity is presented in the difference between magnetic forces relative to the amount of movement, it only requires measurement values of two ends (e.g., two ends for the system to have the maximum amount of movement) for the movement sensing device to exhibit accuracy in the amount of movement, reducing the calibration cost during production. In addition, designing the magnetic element as a special-shaped magnetic element also helps increase the permissible assembly tolerances of the system.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A movement sensing device adapted to sense an amount of movement of an object, and comprising:
   a first magnetic sensor;
   a second magnetic sensor;
   a special-shaped magnetic element having a magnetization direction, being connected to the object, and being adapted to be moved along a direction parallel to a connection line between the first magnetic sensor and the second magnetic sensor, wherein the special-shaped magnetic element, the first magnetic sensor, and the second magnetic sensor are disposed on a plane, and the magnetization direction is perpendicular to the plane; and
   a controller electrically connected to the first magnetic sensor and the second magnetic sensor, wherein the controller calculates the amount of movement according to a difference between magnetic forces sensed by the first magnetic sensor and the second magnetic sensor from the special-shaped magnetic element, the amount of movement is a distance between a reference point on the special-shaped magnetic element and a center point in the direction parallel to the connection line, and the center point is a center between a position of the first magnetic sensor and a position of the second magnetic sensor.

2. The movement sensing device according to claim 1, wherein the special-shaped magnetic element comprises a first part in a shape of an isosceles triangle.

3. The movement sensing device according to claim 2, wherein the special-shaped magnetic element further comprises a second part in a shape of a rectangle, and a long side of the second part is connected with a bottom side of the first part.

4. The movement sensing device according to claim 3, wherein a short side of the second part is less than or equal to a height of the first part.

5. The movement sensing device according to claim 3, wherein a ratio of a short side of the second part and a height of the first part falls within a range from 0 to 1.

6. The movement sensing device according to claim 2, wherein a ratio of a thickness to the special-shaped magnetic element and a height of the first part falls within a range from 0.1 to 1.

7. The movement sensing device according to claim 2, wherein a ratio of a thickness to the special-shaped magnetic element and a bottom side of the first part falls within a range from 0.01 to 0.1.

8. The movement sensing device according to claim 2, wherein a ratio of a height to a bottom side of the first part falls within a range from 0.02 to 0.2.

9. The movement sensing device according to claim 3, wherein a ratio of a short side to the long side of the second part falls within a range from 0.01 to 0.1.

10. The movement sensing device according to claim 2, wherein a distance between any two of a vertex of the first part of the special-shaped magnetic element, the first magnetic sensor, and the second magnetic sensor is greater than 0.

11. The movement sensing device according to claim 1, wherein the reference point is a geometric center of the special-shaped magnetic element.

12. The movement sensing device according to claim 1, wherein the amount of movement is less than or equal to a distance between the position of the first magnetic sensor and the center point.

* * * * *